United States Patent
Zhou et al.

(10) Patent No.: US 12,069,841 B2
(45) Date of Patent: Aug. 20, 2024

(54) RADIATOR AND ELECTRICAL DEVICE

(71) Applicant: Sungrow Power Supply Co., Ltd., Hefei (CN)

(72) Inventors: Jie Zhou, Hefei (CN); Gaozhou Tao, Hefei (CN); Liwen Hu, Hefei (CN)

(73) Assignee: Sungrow Power Supply Co., Ltd., Hefei (CN)

( * ) Notice: Subject to any disclaimer, the term of this patent is extended or adjusted under 35 U.S.C. 154(b) by 308 days.

(21) Appl. No.: 17/440,696

(22) PCT Filed: Nov. 30, 2020

(86) PCT No.: PCT/CN2020/132685
§ 371 (c)(1),
(2) Date: Sep. 17, 2021

(87) PCT Pub. No.: WO2021/109964
PCT Pub. Date: Jun. 10, 2021

(65) Prior Publication Data
US 2022/0192048 A1 Jun. 16, 2022

(30) Foreign Application Priority Data
Dec. 6, 2019 (CN) .......................... 201922177965.9

(51) Int. Cl.
*H05K 7/20* (2006.01)
(52) U.S. Cl.
CPC ........... *H05K 7/209* (2013.01); *H05K 7/2039* (2013.01)
(58) Field of Classification Search
CPC .. H05K 7/209; H05K 7/20927; H05K 7/2039; H05K 7/20409; H05K 7/20418; H05K 5/0217; H05K 7/20436
See application file for complete search history.

(56) References Cited

U.S. PATENT DOCUMENTS 5,515,912 A 5/1996 Daikoku et al.
8,488,321 B2 * 7/2013 Brandenburg ..... H05K 7/20872
165/80.4
(Continued)

FOREIGN PATENT DOCUMENTS

CN 101699620 A 4/2010
CN 201509363 U 6/2010
(Continued)

OTHER PUBLICATIONS

Extended European Search Report for European Application No. 20897364.4, dated Dec. 1, 2022.
(Continued)

*Primary Examiner* — Adam B Dravininkas
(74) *Attorney, Agent, or Firm* — Wolf, Greenfield & Sacks, P.C.

(57) ABSTRACT

A radiator and an electrical device. The radiator includes a heat dissipation substrate and a heat dissipation assembly, wherein the heat dissipation substrate is provided with an installation position for installing the heat dissipation assembly, the installation position is provided with a stress release groove, and the heat dissipation assembly is welded on the installation position. According to the radiator provided in the present application, the stress release groove is provided in the installation position for installing the heat dissipation assembly on the heat dissipation substrate, such that the installation position is isolated from the connecting position of the heat dissipation assembly to form an island structure, and the island structure reduces stress pulling caused by thermal deformation of the two materials of the heat dissipation assembly and the radiator.

11 Claims, 3 Drawing Sheets

(56) References Cited

U.S. PATENT DOCUMENTS

| | | | |
|---|---|---|---|
| 8,995,129 B2* | 3/2015 | Iwata | H01L 23/473 257/714 |
| 2002/0025406 A1* | 2/2002 | Kitazume | C23C 14/12 428/136 |
| 2006/0017202 A1* | 1/2006 | Dratner | F27D 1/12 266/193 |
| 2008/0290499 A1* | 11/2008 | Nishi | H01L 23/473 257/E23.08 |
| 2009/0139704 A1* | 6/2009 | Otoshi | H05K 3/341 165/185 |
| 2010/0002399 A1 | 1/2010 | Mori et al. | |
| 2011/0005076 A1* | 1/2011 | Hallmann | B23K 26/28 29/890.039 |
| 2012/0262883 A1* | 10/2012 | Iwata | H01L 23/473 228/245 |
| 2013/0087307 A1* | 4/2013 | Brandenburg | H05K 7/20872 165/51 |
| 2014/0174706 A1* | 6/2014 | Yamada | F28F 21/02 165/185 |

FOREIGN PATENT DOCUMENTS

| | | |
|---|---|---|
| CN | 102231944 A | 11/2011 |
| CN | 210959284 U | 7/2020 |
| EP | 1 450 401 A1 | 8/2004 |
| EP | 1 873 827 A1 | 1/2008 |
| EP | 1 970 955 A1 | 9/2008 |
| JP | 2013-115201 A | 6/2013 |
| WO | WO 2016/172648 A1 | 10/2016 |

OTHER PUBLICATIONS

International Search Report and Written Opinion for International Application No. PCT/CN2020/132685, mailed Jan. 29, 2021.

* cited by examiner

RADIATOR AND ELECTRICAL DEVICE

This application is a national stage filing under 35 U.S.C. § 371 of International Patent Application Serial No. PCT/CN2020/132685, filed Nov. 30, 2020, which claims priority to Chinese Patent Application No. 201922177965.9, titled "RADIATOR AND ELECTRICAL DEVICE", filed with the China National Intellectual Property Administration on Dec. 6, 2019. The contents of these applications are incorporated herein by reference in their entirety.

FIELD

The present application relates to the technical field of electrical heat dissipation, and in particular to a radiator. The present application further relates to an electrical device including the above radiator.

BACKGROUND

With the increasing integration degree of components, the integration degree of core components of an electrical device is becoming higher and higher, which leads to increase of loss and heat flux. A radiator is generally provided for the heat dissipation of a heat-generating component with large heat or high heat flux. The radiator is generally composed of a heat dissipation substrate and a heat dissipation component mounted on the heat dissipation substrate, and the heat dissipation component is welded on the heat dissipation substrate.

However, due to different materials of the heat dissipation substrate and the heat dissipation component in the conventional technology, thermal expansion coefficients are different, and thermal deformation amounts are different. In the welding combination method, due to the different thermal deformation amounts, tensile stress is formed between the two materials, which causes deformation and increase of flatness of a heat dissipation functional surface of the heat dissipation component for enhanced heat dissipation which is in contact with a heat-generating device, increase of the heat dissipation resistance, and poor reliability of the radiator.

Therefore, a technical problem urgently to be solved by those skilled in the art is how to improve the reliability of the radiator.

SUMMARY

An object according to the present application is to provide a radiator which has an improved heat dissipation effect. Another object according to the present application is to provide an electrical device including the above radiator.

In order to achieve the above objects, a radiator is provided according to the present application, which includes a heat dissipation substrate and a heat dissipation component. A mounting position for mounting the heat dissipation component is provided on the heat dissipation substrate, a stress relieve groove is defined at the mounting position, and the heat dissipation component is welded to the mounting position.

Preferably, at least two stress relieve grooves are defined, and an island structure is formed between two adjacent stress relieve grooves.

Preferably, the stress relieve grooves are arranged in a grid shape, and the island structure is formed between the four stress relieve grooves.

Preferably, the stress relieve grooves are in a loop shape and nested one by one, and the island structure is formed between the two adjacent loop-shaped stress relieve grooves.

Preferably, the stress relieve grooves are respectively a first stress relieve groove and a second stress relieve groove intersecting with the first stress relieve groove, and the first stress relieve groove is parallel to an edge of the heat dissipation substrate.

Preferably, multiple second stress relieve grooves are defined, and two second stress relieve grooves are arranged crosswise.

Preferably, the mounting position is a welding groove recessed below a surface of the heat dissipation substrate.

Preferably, the heat dissipation component is a temperature equalizing plate.

Preferably, multiple mounting positions and multiple heat dissipation components are provided, and the heat dissipation components are in one-to-one correspondence with the mounting positions.

Preferably, all the heat dissipation components are mounted on the same mounting position, and the heat dissipation components are distributed in a length direction of the mounting position in sequence.

Preferably, the radiator further includes heat dissipation fins, the heat dissipation fins and the heat dissipation components are respectively distributed on two opposite sides of the heat dissipation substrate, and at least one set of heat dissipation fins is provided.

An electrical device includes a radiator and a heat-generating device mounted on the radiator, wherein the radiator is the radiator according to any one of the above.

In the above technical solution, the radiator according to the present application includes the heat dissipation substrate and the heat dissipation component. The mounting position for mounting the heat dissipation component is provided on the heat dissipation substrate, the stress relieve groove is defined at the mounting position, and the heat dissipation component is welded to the mounting position.

It can be seen from the above description that, in the radiator according to the present application, by defining the stress relieve groove at the mounting position, for mounting the heat dissipation component, of the heat dissipation substrate, the heat dissipation substrate is isolated at the mounting position from a connecting position of the heat dissipation component; and by defining the stress relieve groove, the stress pulling caused by thermal deformation of two materials of the heat dissipation component and the radiator is reduced, the reliability of the heat dissipation component is improved, the heat dissipation effect of the radiator is ensured, and the service life of the heat dissipation component is prolonged.

BRIEF DESCRIPTION OF THE DRAWINGS

To describe the technical solutions in the embodiments of the present application or in the conventional technology more clearly, the accompanying drawings required for describing the embodiments or the conventional technology are briefly introduced hereinafter. Apparently, the accompanying drawings in the following description show merely the embodiments of the present application; and a person of ordinary skill in the art can derive other drawings from these accompanying drawings without creative efforts.

Figure 1:
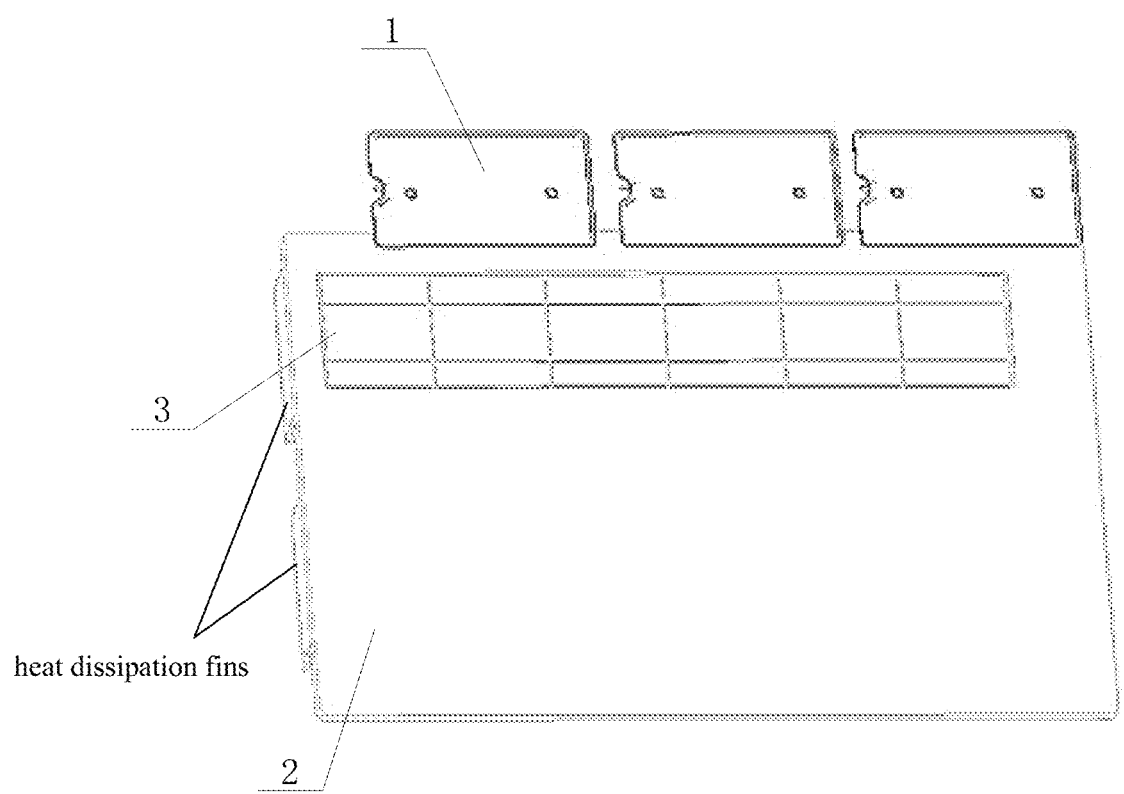
FIG. 1 is a schematic structural diagram of a radiator according to an embodiment of the preset application.

Reference numerals in FIGS. 1 to 4 are listed as follows:

| 1   | heat dissipation component; | 2   | heat dissipation substrate; |
|-----|-----------------------------|-----|-----------------------------|
| 3   | mounting position;          | 4   | stress relieve groove;      |
| 4-1 | first stress relieve groove; | 4-2 | second stress relieve groove; |
| 5   | island structure.           |     |                             |

DETAILED DESCRIPTION OF THE EMBODIMENTS

A core according to the present application is to provide a radiator which has an improved heat dissipation effect. Another core according to the present application is to provide an electrical device including the above radiator.

In order to provide those skilled in the art a better understanding of the technical solutions of the present application, the application will be further described in detail in conjunction with the drawings and specific embodiments.

Reference is made to FIGS. 1 to 4.

In a specific embodiment, the radiator according to a specific embodiment of the present application includes a heat dissipation substrate 2 and a heat dissipation component 1. Specifically, the heat dissipation substrate is made of aluminum alloy, and the heat dissipation component 1 is made of copper. Apparently, the heat dissipation substrate and the heat dissipation component 1 may be made of other materials according to actual needs. In order to reduce the assembly difficulty, the heat dissipation substrate preferably has an integrally formed structure. Specifically, the heat dissipation component 1 may be a temperature equalizing plate.

A mounting position 3 for mounting the heat dissipation component 1 is provided on the heat dissipation substrate 2, a stress relieve groove 4 is defined at the mounting position 3, and the heat dissipation component 1 is welded to the mounting position 3. The stress relieve groove 4 is defined on a welding surface of the heat dissipation substrate and the heat dissipation component 1. Preferably, at least two stress relieve grooves 4 are defined, and an island structure 5 is formed between two adjacent stress relieve grooves 4. Specifically, the stress relieve grooves 4 may have groove bodies arranged in parallel. Specifically, the stress relieve grooves 4 may be directly defined in the welding surface of the heat dissipation substrate and the heat dissipation component 1. Specifically, the groove bodies of all the stress relieve grooves 4 internally communicate with each other.

It can be seen from the above description that, in the radiator according to the specific embodiment of the present application, by defining the stress relieve grooves 4 at the mounting position 3, for mounting the heat dissipation component 1, of the heat dissipation substrate 2, the heat dissipation substrate 2 is isolated at the mounting position 3 from a connecting position of the heat dissipation component 1; and by defining the stress relieve grooves 4, an island structure 5 is formed between two adjacent stress relieve grooves 4, which reduces the stress pulling caused by thermal deformation of two materials of the heat dissipation component 1 and the radiator, relieves the local thermal deformation stress, improves the reliability of the heat dissipation component 1, ensures the heat dissipation effect of the radiator, and prolongs the service life of the heat dissipation component 1.

Figure 2:
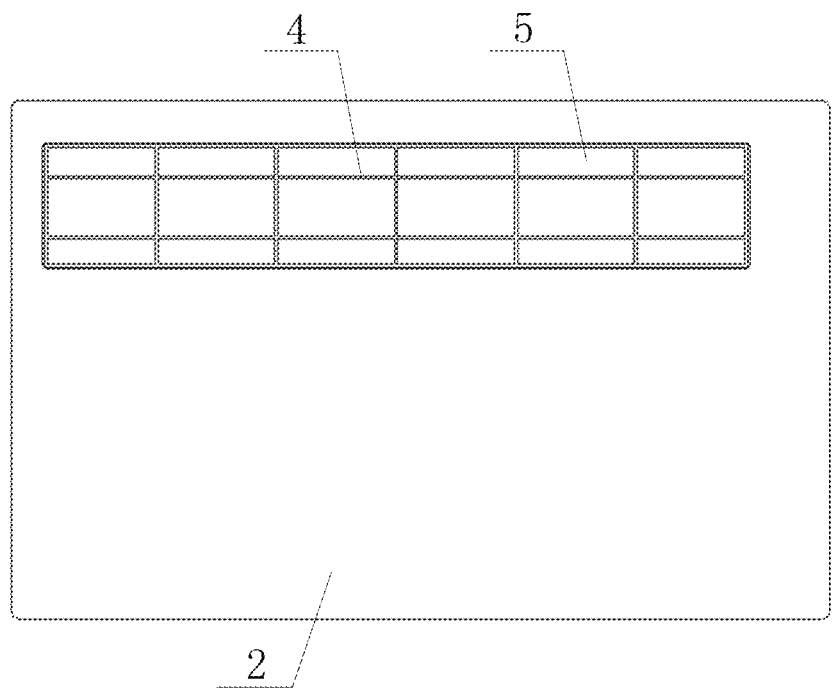
FIG. 2 is a schematic structural diagram of a heat dissipation substrate according to an embodiment of the preset application.

Preferably, as shown in FIG. 2, the stress relieve grooves 4 are arranged in a grid shape, and the island structure 5 is formed between the four stress relieve grooves 4. Preferably, the stress relieve grooves 4 arranged horizontally are equally spaced apart, and the stress relieve grooves 4 arranged longitudinally are equally spaced apart. The stress relieve grooves 4 divide the welding surface of the heat dissipation substrate 2 and the heat dissipation component 1 into multiple areas, so that each of the areas is separated from the thermal deformation of the entire radiator to form the island structure 5.

In a specific embodiment, the stress relieve grooves 4 are respectively a first stress relieve groove 4-1 and a second stress relieve groove 4-2, and the first stress relieve groove 4-1 is parallel to an edge of the heat dissipation substrate 2. Specifically, the first stress relieve groove 4-1 has a groove body structure respectively parallel to a short side and a long side of the heat dissipation substrate 2. In a specific structure, the second stress relieve groove 4-2 intersects with the first stress relieve groove 4-1, and an included angle is an acute angle. Apparently, in specific implementation, the included angle between the second stress relieve groove 4-2 and the first stress relieve groove 4-1 may be a right angle or an obtuse angle. Specifically, the first stress relieve groove 4-1 may be connected to an end of the second stress relieve groove 4-2.

Figure 3:
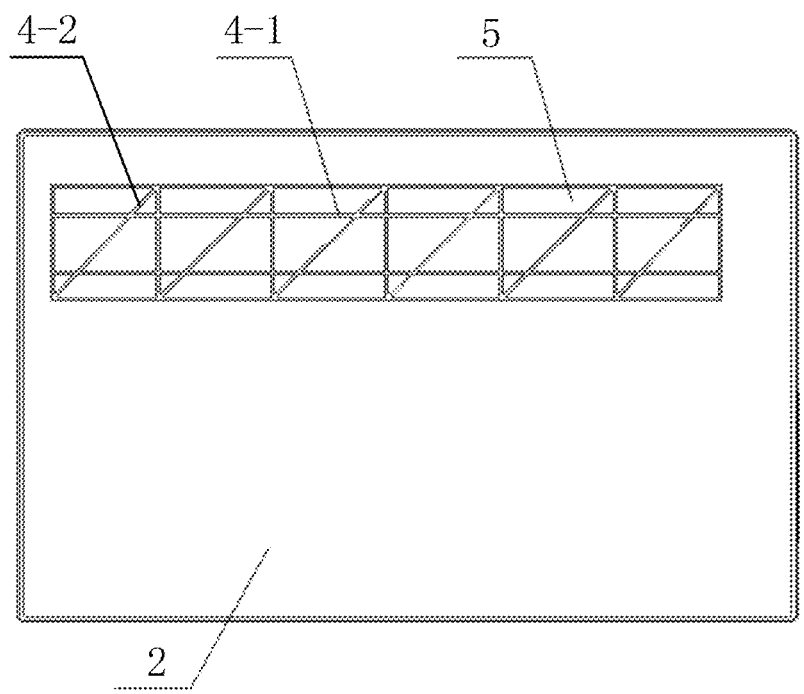
FIG. 3 is a schematic structural diagram of another heat dissipation substrate according to an embodiment of the preset application.

Multiple second stress relieve grooves 4-2 are defined. Specifically, as shown in FIG. 3, the second stress relieve grooves 4-2 may be arranged in parallel. Alternatively, an included angle between extension lines of two adjacent second stress relieve grooves 4-2 may be an acute angle, and the second stress relieve grooves 4-2 are not arranged crosswise in this case. The island structure 5 is defined by the first stress relieve grooves 4-1 and the second stress relieve grooves 4-2.

Figure 4:
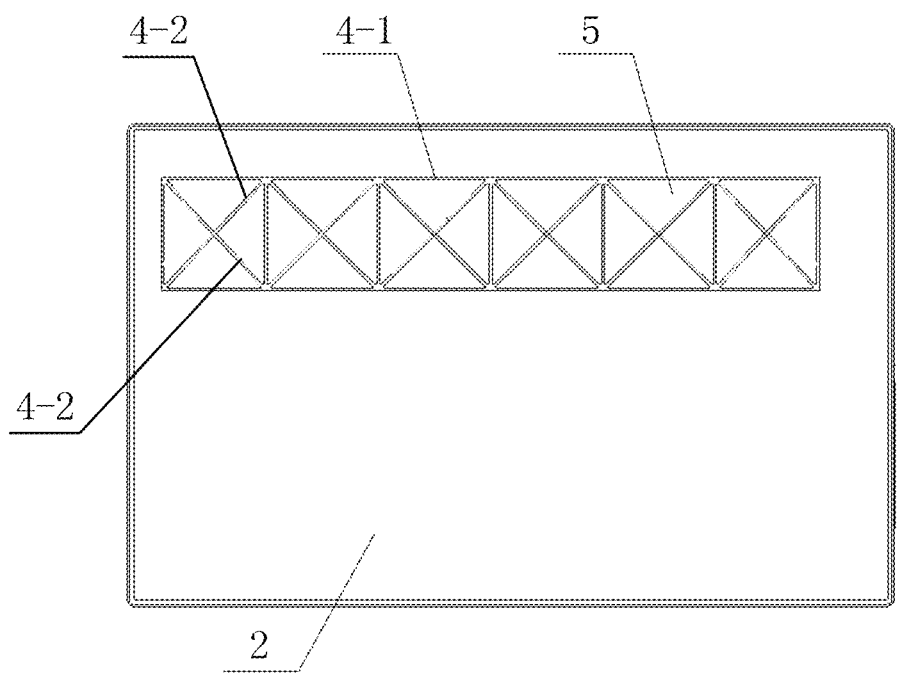
FIG. 4 is a schematic structural diagram of yet another heat dissipation substrate according to an embodiment of the preset application.

As shown in FIG. 4, multiple second stress relieve grooves 4-2 are defined, two second stress relieve grooves 4-2 may arranged crosswise, and an included angle between the crosswise second stress relieve grooves 4-2 may be an acute angle, a right angle or an obtuse angle. An internal space defined by the first stress relieve grooves 4-1 is divided into four independent island structures 5 by two second stress relieve grooves 4-2 internally arranged. By defining the two second stress relieve grooves 4-2, a stress relieve space is further increased, and the deformation caused by the inconsistent thermal expansion coefficients of the heat dissipation component 1 and the heat dissipation substrate 2 is reduced.

In the specific processing, one second stress relieve groove 4-2 may intersect with multiple first stress relieve grooves 4-1, or one of the second stress relieve grooves 4-2 may intersect with other second stress relieve grooves 4-2, or one first stress relieve groove 4-1 may intersect with multiple second stress relieve grooves 4-2.

More specifically, the two intersecting stress relieve grooves 4 may smoothly transition to each other, and the smooth transition may specifically be an arc transition, so as to reduce the stress concentration at corners of the stress relieve grooves 4.

In another specific embodiment, the stress relieve grooves 4 are in a loop shape and nested one by one, and the island structure 5 is formed between two adjacent loop-shaped stress relieve grooves 4. Specifically, the stress relieve grooves 4 may be circular, elliptical or rectangular. Preferably, the stress relieve grooves 4 are arranged concentrically.

In a specific embodiment, the mounting position 3 is a welding groove recessed below a surface of the heat dissipation substrate 2. According to a design of an electrical system, the welding groove may be dispensed with, the heat dissipation component 1 is welded into the welding groove on the heat dissipation substrate, and a heat dissipation functional surface of the heat dissipation component 1 is on the same plane as the surface of the heat dissipation substrate. The welding method is soldering or the like, which is not specifically limited here.

In a specific embodiment, multiple heat dissipation components 1 are provided. Specifically, multiple mounting positions 3 are provided, and the heat dissipation components 1 are in one-to-one correspondence with the mounting positions 3. Preferably, the multiple mounting positions 3 are equally spaced apart.

In another specific embodiment, all the heat dissipation components 1 are mounted on the same mounting position 3, and the heat dissipation components 1 are distributed in a length direction of the mounting position 3 in sequence. Preferably, the heat dissipation components 1 are equally spaced apart in the length direction of the mounting position 3.

The radiator according to the present application further includes heat dissipation fins, the heat dissipation fins and the heat dissipation components 1 are respectively distributed on two opposite sides of the heat dissipation substrate 2, and at least one set of heat dissipation fins is provided. Specifically, two or three sets of heat dissipation fins may be provided, and the heat dissipation fins in each set are equally spaced apart.

Besides, the radiator according to the present application has a simple implementation process and almost no increase in cost, and can be easily popularized.

An electrical device according to the present application includes a radiator and a heat-generating device mounted on the radiator, wherein the radiator is the radiator according to any one of the above. Since the specific structure of the radiator has been described above, the electrical device including the above radiator also has the above technical effects.

Specifically, the electrical device according to the present application may be an inverter or other electrical device.

The embodiments of the present application are described in a progressive manner, with an emphasis placed on explaining the difference between each embodiment and other embodiments. The same or similar parts among the embodiments can be referred to each other.

According to the embodiments disclosed above, a person skilled in the art can implement or use the present application. Various modifications to the embodiments are obvious to the person skilled in the art, and general principles defined in the present application may be implemented in other embodiments without departing from the spirit or scope of the present application. Therefore, the present application shall not be limited to the embodiments described herein but have the widest scope that complies with the principle and novelty disclosed in this specification.

The invention claimed is:

1. A radiator, comprising a heat dissipation substrate and a heat dissipation component, wherein a mounting position for mounting the heat dissipation component is provided on the heat dissipation substrate, a stress relieve groove is formed at the mounting position, and the heat dissipation component is welded to the mounting position,
   wherein the mounting position is a welding groove recessed below a surface of the heat dissipation substrate.

2. The radiator according to claim 1, wherein at least two stress relieve grooves are defined, and an island structure is formed between two adjacent stress relieve grooves.

3. The radiator according to claim 2, wherein the stress relieve grooves are arranged in a grid shape, and the island structure is formed between the four stress relieve grooves.

4. The radiator according to claim 2, wherein the stress relieve grooves are in a loop shape and nested one by one, and the island structure is formed between two adjacent loop-shaped stress relieve grooves.

5. The radiator according to claim 2, wherein the stress relieve grooves are respectively a first stress relieve groove and a second stress relieve groove intersecting with the first stress relieve groove, and the first stress relieve groove is parallel to an edge of the heat dissipation substrate.

6. The radiator according to claim 5, wherein a plurality of second stress relieve grooves are defined, and two of the plural second stress relieve grooves are arranged crosswise.

7. The radiator according to claim 1, wherein the heat dissipation component is a temperature equalizing plate.

8. The radiator according to claim 1, wherein a plurality of mounting positions and a plurality of heat dissipation components are provided, and the plural heat dissipation components are in one-to-one correspondence with the plural mounting positions.

9. The radiator according to claim 8, wherein the plural heat dissipation components are mounted on the same mounting position, and the plural heat dissipation components are distributed in a length direction of the mounting position in sequence.

10. The radiator according to claim 1, further comprising heat dissipation fins, wherein the heat dissipation fins and the heat dissipation component are respectively distributed on two opposite sides of the heat dissipation substrate, and at least one set of heat dissipation fins is provided.

11. An electrical device, comprising a radiator and a heat-generating device mounted on the radiator, wherein the radiator is the radiator according to claim 1.

\* \* \* \* \*